(12) United States Patent
Zhan

(10) Patent No.: US 11,374,048 B2
(45) Date of Patent: Jun. 28, 2022

(54) IMAGE SENSOR, MANUFACTURING METHOD THEREOF AND ELECTRONIC DEVICE

(71) Applicant: SHENZHEN GOODIX TECHNOLOGY CO., LTD., Shenzhen (CN)

(72) Inventor: Chang Zhan, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 175 days.

(21) Appl. No.: 16/714,705

(22) Filed: Dec. 14, 2019

(65) Prior Publication Data

US 2020/0251517 A1 Aug. 6, 2020

Related U.S. Application Data

(63) Continuation of application No. PCT/CN2019/074294, filed on Jan. 31, 2019.

(51) Int. Cl.
*H01L 27/14* (2006.01)
*H01L 27/146* (2006.01)
*H04N 5/378* (2011.01)
*H04N 5/369* (2011.01)

(52) U.S. Cl.
CPC .... *H01L 27/14634* (2013.01); *H01L 27/1469* (2013.01); *H01L 27/14636* (2013.01); *H04N 5/378* (2013.01); *H04N 5/379* (2018.08)

(58) Field of Classification Search
CPC ......... H01L 27/14634; H01L 27/14636; H01L 27/1469; H04N 5/378; H04N 5/379
See application file for complete search history.

(56) References Cited

U.S. PATENT DOCUMENTS

| | | |
|---|---|---|
| 9,165,968 B2 | 10/2015 | Chao et al. |
| 9,728,575 B1 | 8/2017 | Lee et al. |
| 2011/0141318 A1 | 6/2011 | Lee et al. |
| 2012/0293698 A1 | 11/2012 | Sukegawa et al. |
| 2013/0001728 A1 | 1/2013 | De Amicis |
| 2013/0128086 A1 | 5/2013 | Juen |
| 2014/0077057 A1 | 3/2014 | Chao et al. |
| 2015/0312500 A1 | 10/2015 | Sukegawa et al. |
| 2016/0065876 A1 | 3/2016 | Juen |
| 2016/0286150 A1 | 9/2016 | Sukegawa et al. |
| 2017/0012075 A1 | 1/2017 | Sukegawa et al. |

(Continued)

FOREIGN PATENT DOCUMENTS

| | | |
|---|---|---|
| CN | 103681703 A | 3/2014 |
| CN | 105282464 A | 1/2016 |

(Continued)

*Primary Examiner* — Tony Ko

(57) ABSTRACT

An image sensor and a manufacturing method thereof, and an electronic device, which is capable of reducing the cost of the image sensor. The image sensor includes: a pixel array module disposed on a first wafer; a signal processing module disposed on a second wafer; an electrical connection module connecting the pixel array module and the signal processing module; wherein the pixel array module is configured to receive an optical signal and convert the optical signal into an electrical signal, and the signal processing module is configured to process the electrical signal.

20 Claims, 5 Drawing Sheets

(56) References Cited

U.S. PATENT DOCUMENTS

| | | |
|---|---|---|
| 2017/0180668 A1 | 6/2017 | Sukegawa et al. |
| 2017/0229509 A1 | 8/2017 | Lee et al. |
| 2017/0318251 A1 | 11/2017 | Juen |
| 2017/0330912 A1 | 11/2017 | Sukegawa et al. |
| 2018/0026067 A1 | 1/2018 | Lee et al. |
| 2018/0097031 A1 | 4/2018 | Sukegawa et al. |
| 2018/0337209 A1* | 11/2018 | Narui ................ H01L 27/14685 |
| 2018/0350858 A1 | 12/2018 | Oishi et al. |
| 2019/0148436 A1 | 5/2019 | Sukegawa et al. |
| 2019/0181170 A1 | 6/2019 | Oishi et al. |
| 2019/0320131 A1 | 10/2019 | Juen |
| 2019/0341416 A1 | 11/2019 | Sukegawa et al. |
| 2020/0059620 A1 | 2/2020 | Shimizu et al. |

FOREIGN PATENT DOCUMENTS

| | | |
|---|---|---|
| CN | 105355621 A | 2/2016 |
| CN | 106534728 A | 3/2017 |
| CN | 206179866 | 5/2017 |
| CN | 206301795 U | 7/2017 |
| EP | 2528093 A1 | 11/2012 |
| WO | 2018198802 A1 | 11/2018 |

* cited by examiner

IMAGE SENSOR, MANUFACTURING METHOD THEREOF AND ELECTRONIC DEVICE

CROSS-REFERENCE TO RELATED APPLICATIONS

This application is a continuation of International Application No. PCT/CN2019/074294, filed on Jan. 31, 2019, the disclosure of which is hereby incorporated by reference in its entirety.

TECHNICAL FIELD

The present application relates to the field of image sensor, and in particular, to an image sensor, a manufacturing method thereof and an electronic device.

BACKGROUND

With the development of semiconductor and integrated circuit technology, the device types of chips are becoming more and more abundant, with more process requirements and a greater number of process layers, so the cost of chips is getting higher and higher. Since the overall chip cost is affected by the device type and process complexity of each part of the chip, the cost per unit area of the chip is determined by the portion corresponding to the highest cost per unit area.

In an image sensor chip, a pixel array unit and a signal processing unit are included, where the pixel array unit occupies most of the area of the chip, while the signal processing unit occupies a small area. Generally, the pixel array unit has a small device type and a low process requirement, and thus the cost per unit area corresponding to the pixel array unit is relatively low. While the signal processing unit includes a variety of device types, which requires a more complicated process, and thus the cost per unit area corresponding to the signal processing unit is relatively high. In the existing image sensor chip, the cost per unit area of the chip is generally determined by the cost per unit area of the signal processing unit, and the total cost of the chip is high.

SUMMARY

Embodiments of the present application provide an image sensor and a manufacturing method thereof, and an electronic device, which is capable of reducing the cost of the image sensor.

In a first aspect, an image sensor is provided, including: a pixel array module disposed on a first wafer; a signal processing module disposed on a second wafer; an electrical connection module connecting the pixel array module and the signal processing module; where the pixel array module is configured to receive an optical signal and convert the optical signal into an electrical signal, and the signal processing module is configured to process the electrical signal.

In the technical solution of the embodiment of the present application, devices of the image sensor are disposed on two wafers, and the connection is realized by electrical connection module between the two wafers, which can reduce the cost of the image sensor.

In one possible implementation manner, devices in the pixel array module consist of analog devices, and devices in the signal processing module includes digital devices.

The pixel array module consisting of analog devices is disposed on a single wafer, which may reduce the cost of the module.

In one possible implementation manner, the pixel array module includes a first metal interconnect layer of a first predetermined number, the first metal interconnect layer is configured for interconnection of the devices in the pixel array module, and the first predetermined number is less than or equal to 4.

In one possible implementation manner, the first metal interconnect layer is connected to the electrical connection module.

In one possible implementation manner, the signal processing module includes a second metal interconnect layer of a second predetermined number, the second metal interconnect layer is configured for interconnection of the devices in the signal processing module, and the second predetermined number is greater than or equal to 4.

In one possible implementation manner, the second metal interconnect layer is connected to the electrical connection module.

In one possible implementation manner, the pixel array module includes a pixel array circuit including a plurality of pixel sensitive units configured to receive the optical signal and convert the optical signal into the electrical signal.

In one possible implementation manner, the pixel array module further includes a row and column control circuit configured to receive a control signal generated by the signal processing module, and to control the plurality of pixel sensitive units for receiving the optical signal and converting the optical signal to the electrical signal.

In one possible implementation manner, the pixel array module further includes a readout circuit configured to receive the electrical signal output by the plurality of pixel sensitive units and send the electrical signal to the signal processing module.

In one possible implementation manner, the readout circuit includes an amplifying circuit configured to amplify the electrical signal output by the plurality of pixel sensitive units.

In one possible implementation manner, the signal processing module includes an analog to digital conversion circuit configured to receive the electrical signal generated by the pixel array module and convert the electrical signal into a digital electrical signal.

In one possible implementation manner, the signal processing module further includes a digital processing circuit configured to receive the digital electrical signal generated by the analog to digital conversion circuit and process the digital electrical signal.

In one possible implementation manner, the signal processing module further includes a logic control circuit configured to generate a control signal.

In one possible implementation manner, the signal processing module further includes a storage circuit configured to store a particular signal, where the particular signal includes a signal processed by the digital processing circuit.

In one possible implementation manner, the analog to digital conversion circuit is connected to the amplifying circuit through the electrical connection module, and the logic control circuit is connected to the row and column control circuit and the readout circuit through the electrical connection module.

That is to say, the electrical connection module between the two wafers is disposed between the analog to digital conversion circuit and the amplifying circuit, and between the logic control circuit and the row and column control circuit and the readout circuit. With this arrangement, the implementation complexity of the electrical connection module between the two wafers can be reduced.

In one possible implementation manner, the electrical connection module is configured to transmit the electrical signal generated by the pixel array module and a control signal generated by the signal processing module.

In one possible implementation manner, the electrical connection module includes a wire bonding apparatus.

In one possible implementation manner, the first wafer and the second wafer are epitaxial wafers or standard wafers.

In one possible implementation manner, the first wafer and the second wafer are disposed in stack.

In a second aspect, a manufacturing method of an image sensor is provided, including:

preparing a pixel array module on a first wafer;

preparing a signal processing module on a second wafer; and connecting the pixel array module and the signal processing module by preparing an electrical connection module.

In one possible implementation manner, devices in the pixel array module consist of analog devices, and devices in the signal processing module include digital devices.

In one possible implementation manner, the pixel array module includes a first metal interconnect layer of a first predetermined number, the devices in the pixel array module are interconnected through the first metal interconnect layer, and the first predetermined number is less than or equal to 4.

In one possible implementation manner, the pixel array module is connected to the electrical connection module through the first metal interconnect layer.

In one possible implementation manner, the pixel array module includes a pixel array circuit including a plurality of pixel sensitive units.

In one possible implementation manner, the pixel array module includes a row control circuit and a column control circuit, where the row control circuit is connected to a pixel sensitive unit row in the pixel array circuit through the first metal interconnect layer, and the column control circuit is connected to a pixel sensitive unit column in the pixel array circuit through the first metal interconnect layer.

In one possible implementation manner, the row control circuit and the column control circuit are connected to the electrical connection module through the first metal interconnect layer.

In one possible implementation manner, the pixel array module further includes a readout circuit connected to the column control circuit and the electrical connection module through the first metal interconnect layer.

In one possible implementation manner, the readout circuit includes an amplifying circuit connected to the column control circuit and the electrical connection module through the first metal interconnect layer.

In one possible implementation manner, the signal processing module includes a second metal interconnect layer of a second predetermined number, the devices in the signal processing module are interconnected through the second metal interconnect layer, and the second predetermined number is greater than or equal to 4.

In one possible implementation manner, the signal processing module is connected to the electrical connection module through the second metal interconnect layer.

In one possible implementation manner, the signal processing module includes an analog to digital conversion circuit connected to the electrical connection module through the second metal interconnect layer.

In one possible implementation manner, the signal processing module further includes a digital processing circuit connected to the analog to digital conversion circuit through the second metal interconnect layer.

In one possible implementation manner, the signal processing module further includes a logic control circuit connected to the analog to digital conversion circuit, the digital processing circuit, the storage circuit, and the electrical connection module through the second metal interconnect layer.

In one possible implementation manner, the signal processing module further includes a storage circuit configured to be connected to the digital processing circuit through the second metal interconnect layer.

In one possible implementation manner, the analog to digital conversion signal is connected to the readout circuit through the electrical connection module, and the logic control circuit is connected to the row control circuit, the column control circuit, and the readout circuit through the electrical connection module.

In one possible implementation, the electrical connection module includes a wire bonding apparatus.

In one possible implementation manner, the first wafer and the second wafer are epitaxial wafers or standard wafers.

In one possible implementation manner, the first wafer and the second wafer are disposed in stack.

In a third aspect, an electronic device is provided, including: the image sensor of the first aspect or any one of its implementation manners.

BRIEF DESCRIPTION OF DRAWINGS

FIG. 3 (*b*) is a schematic cross-sectional diagram of a signal processing module of an image sensor according to an embodiment of the present application.

FIG. 4 (*b*) is a schematic functional structural diagram of a signal processing module of an image sensor according to an embodiment of the present application.

DESCRIPTION OF EMBODIMENTS

The technical solutions in embodiments of the present application will be described hereinafter in conjunction with the accompanying drawings.

It should be understood that specific examples in embodiments of the present application are just for helping those skilled in the art better understand the embodiments of the present application, rather than for limiting the scope of the present application.

It should be further understood that, in various embodiments of the present application, the sequence number of each process does not mean the order of execution, and the order of execution of each process should be determined by its function and internal logic, and should not set any limitation to the implementation process of the embodiments of the present application.

It should be understood that the various embodiments described in the present specification may be implemented separately or in combination, which is not limited by the embodiments of the present application.

The technical solutions of the embodiments of the present application can be applied to various image sensors, such as a biometric image sensor, which is not limited by the embodiments of the present application.

As a common application scenario, the image sensor provided in embodiments of the present application may be applied to a smart phone, a camera, a tablet computer and another mobile terminal having an imaging function or another terminal device.

Figure 1:
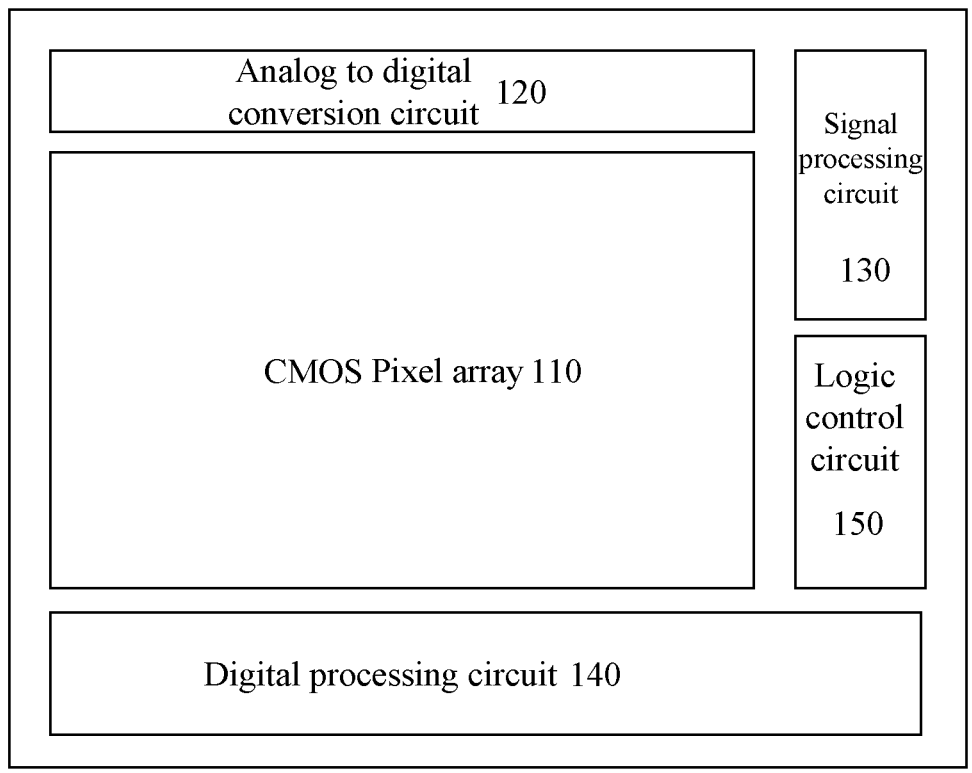
FIG. 1 is a schematic diagram of an image sensor according to an embodiment of the present application.

FIG. 1 shows a schematic diagram of an example of a complementary metal oxide semiconductor (CMOS) image sensor 10. As shown in FIG. 1, the CMOS image sensor 10 is a CMOS image sensor chip, including: a CMOS pixel array 110, an analog to digital conversion circuit 120, a signal processing circuit 130, a digital processing circuit 140, and a logic control circuit 150. The CMOS pixel array 110 receives an optical signal and converts the optical signal into an electrical signal and transmits the electrical signal to the signal processing circuit 130 and the analog to digital conversion circuit 120. After being processed by the analog to digital conversion circuit 120, a digital signal is obtained, and the digital signal is transmitted to the digital processing circuit 140 for digital signal processing to obtain an image signal. The logic control circuit 150 provides timing and other various control signals for the CMOS pixel array 110, the analog to digital conversion circuit 120, the signal processing circuit 130, and the digital processing circuit 140.

In the CMOS image sensor 10, the total number of pixels of the CMOS pixel array 110 is one of the main technical indicators for measuring the CMOS image sensor, and determines various factors such as the photographic performance, resolution, and the like of the CMOS image sensor. Thus, the CMOS pixel array 110 occupies a large portion of the chip area, generally more than 70% of the total chip area. In the CMOS pixel array 110, an array consists of a plurality of pixel sensitive units is mainly included, and each of the pixel sensitive units consists of one photo diode and one or more CMOS switching transistors, so that the CMOS pixel array has a small device type, the circuit structure is relatively simple, and the device process requirements are relatively low.

In the CMOS image sensor 10, except for the CMOS pixel array 110, other functional circuits occupy a relatively small portion of the chip area, typically less than 30% of the total chip area. But among these functional circuits, such as the digital processing circuit 140, the circuit structure is relatively complex with a great many of device types and high integration due to the need for implementing more complex functions, and therefore the process requirements are relatively high.

In the semiconductor integrated circuit process, the manufacturing cost of the chip includes the cost of the wafer, the test, the package, and the mask. The cost of the mask is the cost required to manufacture the chip by using different process technologies, and it is greatly increased for those circuit with high integration and high requirements on device process. Since the overall process requirement of the chip is determined by the circuit unit having the highest process requirement in the chip, the mask cost per chip area of the chip is the mask cost per unit area of the circuit unit having the highest process requirement.

For example, if the area of the CMOS image sensor 10 is S, where the circuit with the highest process requirement is the digital processing circuit 140, and the cost per unit area of the digital processing circuit 140 is CB, then the cost of the entire CMOS image sensor 10 is CB*S. The digital processing circuit 140 only occupies a small chip area in the entire CMOS image sensor 10; however due to the high process requirements for the digital processing circuit 140, the process cost of the chip is greatly increased, resulting in waste of cost.

Hereinafter, an image sensor according to an embodiment of the present application will be described in detail with reference to FIGS. 2 to 5.

It should be noted that in the embodiments illustrated below, the same structure is denoted by the same reference numeral for ease of understanding, and detailed description of the same structure is omitted for brevity.

Figure 2:
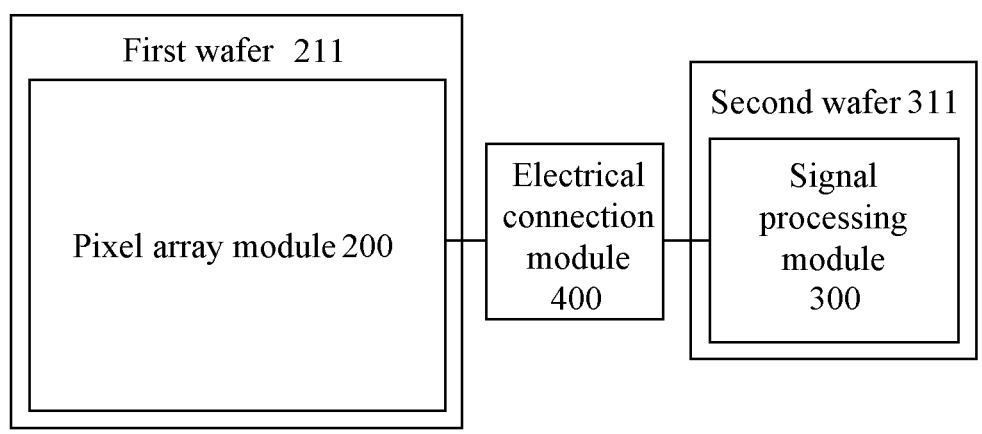
FIG. 2 is a schematic structural diagram of an image sensor according to another embodiment of the present application.

FIG. 2 is a schematic structural diagram of an image sensor 20 according to an embodiment of the present application. As shown in FIG. 2, the image sensor 20 includes a pixel array module 200, a signal processing module 300, and an electrical connection module 400. The pixel array module 200 is disposed on a first wafer 211, the signal processing module 300 is disposed on a second wafer 311, and the electrical connection module 400 connects the pixel array module 200 and the signal processing module 300. The pixel array module 200 is configured to receive an optical signal and convert the optical signal into an electrical signal, and the signal processing module 300 is configured to process the electrical signal. In the embodiment of the present application, the pixel array module 200 may include the CMOS pixel array 110 of FIG. 1, and the signal processing module 300 may include the analog to digital conversion circuit 120, the signal processing circuit 130, the digital processing circuit 140, and the logic control circuit 150 in FIG. 1.

Optionally, the image sensor 20 is a complementary metal oxide semiconductor image sensor (CMOS image sensor, CIS), such as a CMOS passive pixel sensor (CMOS-PPS), a CMOS active pixel sensor (CMOS-APS), and a CMOS digital pixel sensor (CMOS-DPS). Correspondingly, the pixel array module 200 includes a pixel sensitive unit array, where the pixel sensitive unit column can be a passive pixel sensitive unit or an active pixel sensitive unit.

Optionally, the image sensor 20 is a charge coupled device (CCD) image sensor. Correspondingly, the pixel array module 200 includes a metal oxide semiconductor (MOS) photosensitive element array, where one MOS photosensitive element array is a MOS capacitor.

Figure 3:
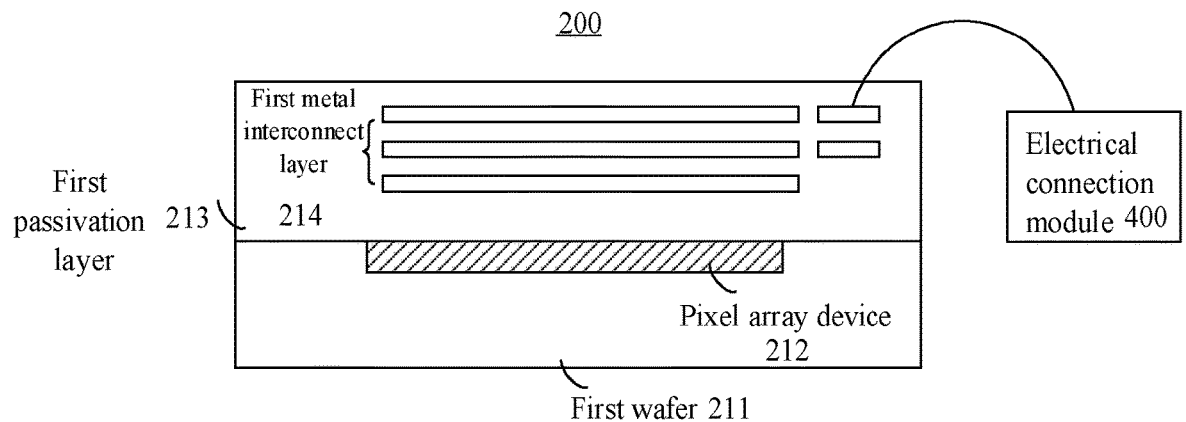
FIG. 3 (*a*) is a schematic cross-sectional diagram of a pixel array module of an image sensor according to an embodiment of the present application.
Figure 3:
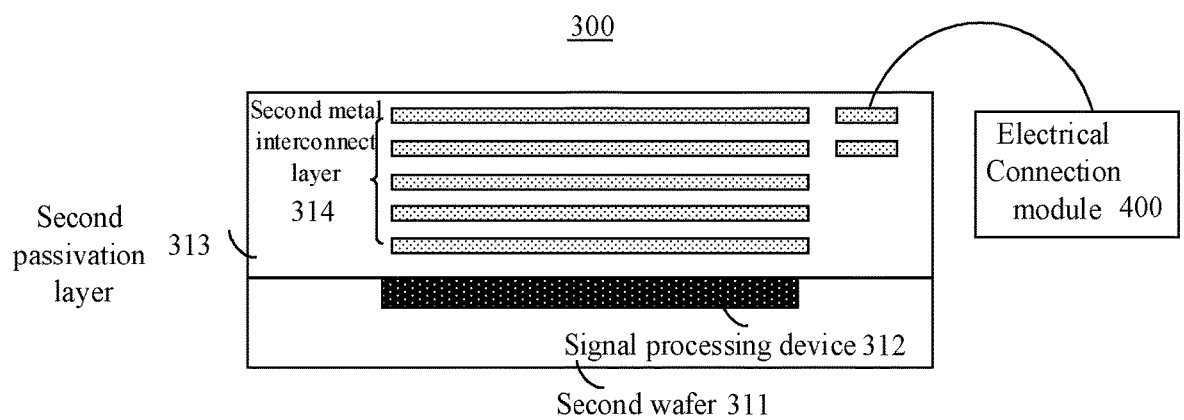

FIG. 3 is a schematic cross-sectional diagram of a pixel array module 200 and a signal processing module 300 of an image sensor 20 according to an embodiment of the present application. FIG. 3 (a) is a schematic cross-sectional diagram of a pixel array module 200 of an embodiment of the present application, and FIG. 3 (b) is a schematic cross-sectional diagram of a signal processing module 300 of an embodiment of the present application.

As shown in FIG. 3 (a), the pixel array module 200 is disposed on a first wafer 211, and includes a pixel array device 212, a first passivation layer 213, and a first metal interconnect layer 214 of a first predetermined number.

The pixel array device 212 is an analog device, and the analog device is a device in an analog circuit for processing an analog signal, such as a resistor, a capacitor, an inductor, a diode, a transistor, a field effect transistor, an analog amplifier, etc. In the embodiment of the present application, a supply voltage of the analog circuit may be 3.3V.

Specifically, the pixel array device 212 includes devices such as a photo diode, a metal oxide semiconductor field effect transistor (MOSFET), etc.

The first metal interconnect layer 214 of the first predetermined number is used for interconnection between the pixel array devices 212 in the pixel array module 200.

Optionally, the first predetermined number is less than or equal to 4, and may generally be 2 or 3. For example, as shown in FIG. 3 (a), the first metal interconnect layer 214 includes three metal interconnect layers. Multiple layers in the first metal interconnect layer 214 may be connected to the pixel array device 212.

Optionally, one or more layer of the first metal interconnect layer 214 may also be used to electrically connect with other modules in the image sensor 20, such as with the electrical connection module 400.

Optionally, the multiple layers of metals in the first metal interconnect layer 214 may be the same metal or different metals, and may be pure metals or alloys. For example, aluminum or copper.

The first passivation layer 213 is used for isolating the pixel array device 212 from the first metal interconnect layer 214 and isolating the multiple layers of metals in the first metal interconnect layer 214 so as to prevent interference of electrical signals, and also for passivation of the metal layer in contact with the air in the first metal interconnect layer 214 so that a surface of the metal layer turns into a stable state.

Optionally, the first passivation layer 213 includes a plurality of passivation layers, which may be passivation layers of different materials, or may be passivation layers of the same material, for example, the first passivation layer 213 is a silicon nitride passivation layer.

In the embodiment of the present application, the first metal interconnect layer 214, the pixel array device 212, and the first passivation layer 213 form a pixel array circuit in the pixel array module 200.

As shown in FIG. 3 (b), the signal processing module 300 is disposed on a second wafer 311, and includes a signal processing device 312, a second passivation layer 313, and a second metal interconnect layer 314 of a second predetermined number.

The signal processing device 312 includes a digital device. Optionally, the signal processing device 312 also includes an analog device. The digital device is a device in a digital circuit for processing digital signals, the digital circuit including various gate circuits, flip-flops, and various combinational logic circuits and sequential logic circuits composed of them. In the embodiment of the present application, the supply voltage of the digital circuit may be 1.8V.

Specifically, the signal processing device 312 includes: an analog to digital converter (ADC), a digital signal processor (DSP), a memory, and the like.

Since the pixel array device 212 is an analog device and the signal processing device 312 is a digital device, the requirements for device fabrication process of the two are different. In the embodiment of the present application, the signal processing device 312 has more devices types than those of the pixel array device 212, and the spacing between devices is small with higher device performance requirements. Therefore, the fabrication process requirement of the signal processing device 312 is higher than that of the pixel array device 212, so that the cost of the signal processing device 312 is higher than that of the pixel array device 212.

The second metal interconnect layer 314 of the second predetermined number is used for interconnection between the signal processing devices 312 in the signal processing module 300.

Optionally, the second predetermined number is greater than or equal to 4, and may generally be 5 or 6. For example, as shown in FIG. 3 (b), the second metal interconnect layer 314 includes five metal interconnect layers. Multiple layers in the second metal interconnect layer 314 may be connected to the signal processing device 312.

Optionally, one or more layers of the second metal interconnect layer 314 may also be used to electrically connect with other modules in the image sensor, such as with the electrical connection module 400.

Optionally, the multiple layers of metals in the second metal interconnect layer 314 may be the same metal or different metals, and may be pure metals or alloys. For example, aluminum or copper.

The second metal interconnect layer 314 is connected to the signal processing device 312, the first metal interconnect layer 214 is connected to the pixel array device 212, but the device spacing of the signal processing device 312 is smaller than that of the pixel array device 212, and the performance requirement of the signal processing device 312 is higher than that of the pixel array device 212. Therefore, the process requirements such as the line and space width of the second metal interconnect layer 314 are lower than those of the first metal interconnect layer 214, and the second metal interconnect layer 314 has more layers than those of the first metal interconnect layer 214, so that the cost of the second metal interconnect layer 314 is higher than that of the first metal interconnect layer 214.

The second passivation layer 313 is used for isolating the signal processing device 312 from the second metal interconnect layer 314 and isolating the multiple layers of metals in the second metal interconnect layer 314, and also for passivation of the metal layer in contact with the air in the second metal interconnect layer 314.

Optionally, the second passivation layer 313 includes a plurality of passivation layers, which may be passivation layers of different materials, or may be passivation layers of the same material, for example, the second passivation layer 313 is a silicon nitride ($Si_3N_4$) passivation layer.

In the embodiment of the present application, the second metal interconnect layer 314, the signal processing device 312, and the second passivation layer 313 form a signal processing circuit in the signal processing module 300.

The pixel array module 200 and the signal processing module 300 are respectively disposed on different wafers. Therefore, the pixel array module 200 and the signal processing module 300 may be separately prepared, thereby performing process control on the two modules separately. The signal processing module 300 has more device types and more complicated circuit structures than those of the pixel array module 200, and the corresponding process requirement and mask cost are also higher. When the pixel array module 200 and the signal processing module 300 are fabricated together on a same wafer, the high process requirement of the signal processing module 300 affects that of the pixel array module 200, so that the pixel array module 200 is also prepared by a high process requirement. This results in a waste of process cost for the pixel array module 200. Therefore, in the embodiment of the present application, the process requirement of separately preparing the pixel array module 200 and the reduction in the mask cost help to reduce the cost of the image sensor 20 as a whole.

It should be understood that the pixel array module 200 and the signal processing module 300 may be two independent chips, which are respectively packaged in separate chips, or may be exposed chip modules grown on two wafers, and the two exposed chip modules are packaged to form one chip.

It should be understood that the image sensor 20 may further include a plurality of other functional modules, which may be disposed on a plurality of wafers such as a third wafer, which is not limited in this embodiment.

Optionally, the electrical connection module 400 is any apparatus that implements electrical connection, and may be a wire bonding (WB) apparatus. For example, the electrical connection module 400 may be a bonding wire of Au.

It should be understood that the electrical connection may also be a micro metal connection post or other electrical connection manners such as a connector, as long as electrical connection between the two electrical modules may be achieved, which is not limited by the embodiment of the present application.

Optionally, the first wafer 211 and the second wafer 311 may be horizontally separated, that is, the first wafer 211 and the second wafer 311 are located on the same horizontal plane without overlapping with each other, and this connection process is of simple implementation and low cost.

Optionally, the first wafer 211 and the second wafer 311 may be disposed in stack, that is, the first wafer 211 and the second wafer 311 are stacked on top of each other. Preferably, the first wafer 211 is disposed above the second wafer 311. In this manner a photosensitive circuit, that is, the pixel array module 200, is disposed above a non-photosensitive circuit, that is, the signal processing module 300, so that the area ratio of the pixel array module 200 in the image sensor 20 can be enlarged, that is, the photosensitive area of the image sensor 20 can be enlarged.

Optionally, the first wafer 211 and the second wafer 311 may be an epitaxial wafer (Epi-wafer), that is, a single crystal material having a same lattice arrangement with the substrate, which is grown on a single crystal silicon (Si) substrate by an epitaxial process. The epitaxial layer may be a homoepitaxial layer of silicon (Si) or a heteroepitaxial layer of silicon germanium (SiGe) or silicon carbide (SiC). The performance of the epitaxial wafer is superior but the cost is high.

Optionally, the first wafer 211 and the second wafer 311 may also be a general standard wafer, that is, a silicon wafer that is produced not by an epitaxial process. The standard wafer costs less than the epitaxial wafer. Preferably, the first wafer 211 is a low cost standard wafer.

In the solution of the embodiment of the present application, the pixel array module 200 is manufactured by using a simple and low-demand process, and the signal processing module 300 is manufactured by using a precise and high-demand process, where the cost per unit area of the pixel array module 200 is lower than that of the signal processing module 300. For example, in the embodiment of the present application, the cost per unit area of the pixel array module 200 is CA, and that of the signal processing module 300 is CB, CB=1.5CA~2CA.

The larger the area ratio of the pixel array module 200 and the signal processing module 300 in the image sensor, the more cost reduction by adopting the apparatus and the method of separating the pixel array module 200 and the signal processing module 300 in the embodiment of the present application. For example, in the embodiment of the present application, the area ratio of the pixel array module 200 to the signal processing module 300 is greater than or equal to 7:3.

With the method in the embodiment of the present application, in which the pixel array module 200 and the signal processing module 300 are separated, the cost of connecting the pixel array module 200 and the connection module 230 of the signal processing module 300 is small compared with the cost of manufacturing the pixel array module 200. For example, in the embodiment of the present application, the cost of the connection module 230 is CC, and the area of the pixel array module 200 is 0.7 S, where S is the wafer area of the image sensor 20, and CC=0.05CA*S.

If the pixel array module 200 and the signal processing module 300 are on the same wafer, the wafer area of the image sensor 20 is S. The area of the pixel array module 200 is 0.7 S and the cost per unit area thereof is CA, the wafer area of the signal processing module 300 is 0.3 S and the cost per unit area thereof is CB, and CB=1.5CA, and then the cost of the image sensor 20 is P1=CB*S=1.5 CA*S.

As shown in FIG. 2, in the embodiment of the present application, the pixel array module 200 and the signal processing module 300 are connected through the connection module 230. The cost of the connection module 230 is CC=0.05CA*S, and then the cost of the image sensor 20 is P2=CA*0.7 S+CB*0.3 S+CC=1.2CA*S.

Therefore, in the embodiment of the present application, the cost saved by the image sensor 20 is ΔP=P1−P2=0.3CA*S, that is, the cost is reduced by 20% compared with the case where the pixel array module 200 and the signal processing module 300 are on the same wafer.

Figure 4:
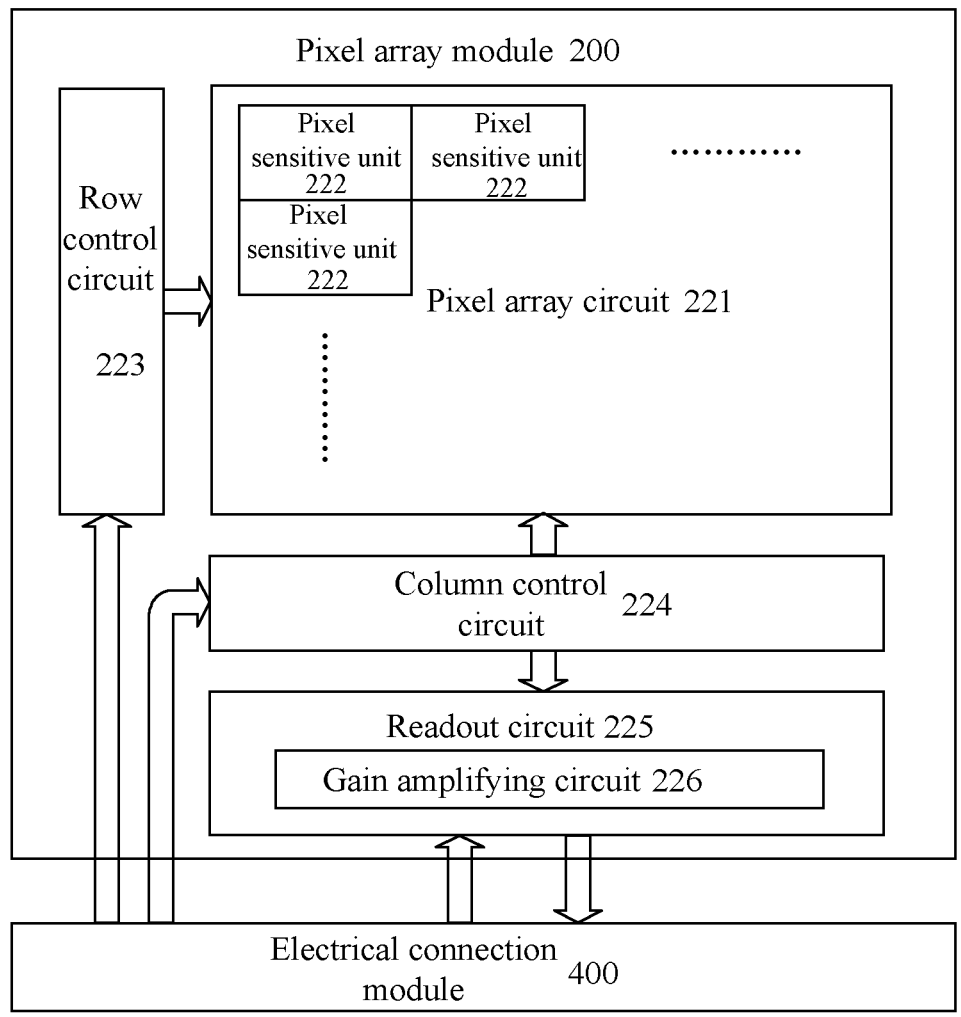
FIG. 4 (*a*) is a schematic functional structural diagram of a pixel array module of an image sensor according to an embodiment of the present application.
Figure 4:
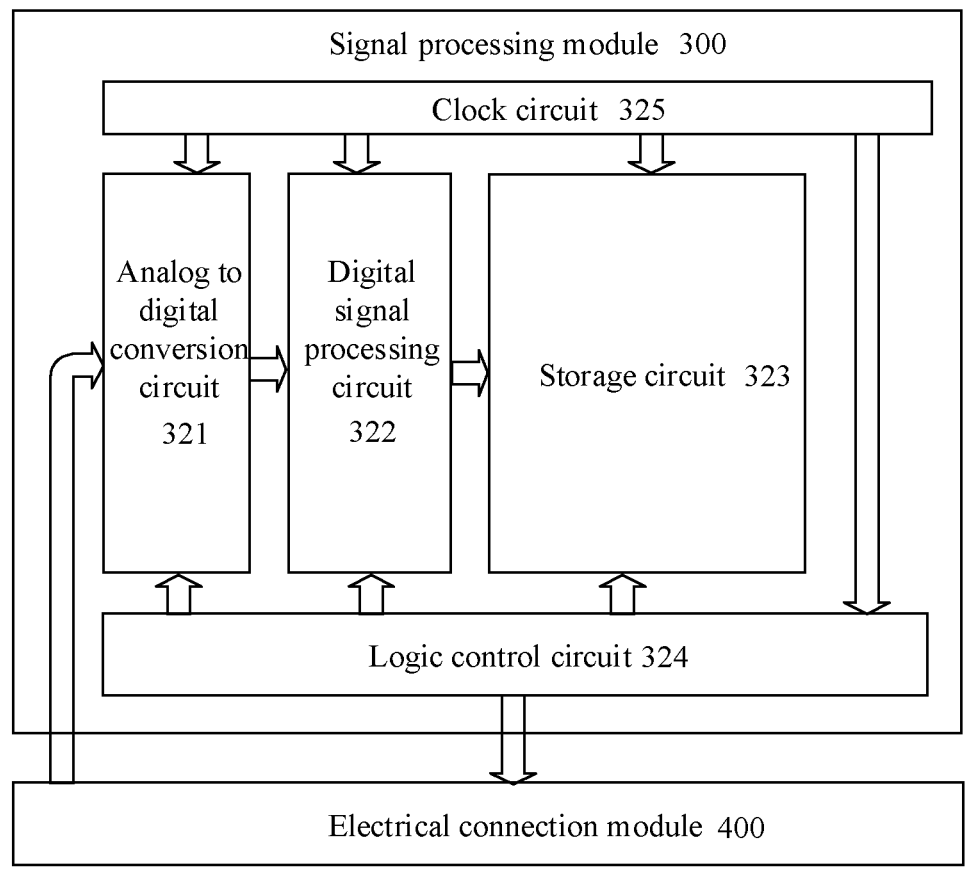

FIG. 4 (a) and FIG. 4 (b) are schematic functional structural diagrams of a pixel array module 200 and a signal processing module 300 according to an embodiment of the present application. FIG. 4 (a) is a schematic functional structural diagram of a pixel array module 200 of an embodiment of the present application, and FIG. 4 (b) is a schematic functional structural diagram of a signal processing module 300 of an embodiment of the present application.

As shown in FIG. 4 (a), the pixel array module 200 includes a pixel array circuit 221 including a plurality of pixel sensitive units 222 configured to receive an optical signal and convert the optical signal into an electrical signal.

Optionally, the pixel sensitive unit 222 is a passive pixel sensitive unit composed of a photo diode and a field effect switch transistor.

Optionally, the pixel sensitive unit 222 is an active pixel sensitive unit composed of a photo diode, a field effect switch transistor and an amplifier.

Specifically, the photo diode in the pixel sensitive unit is configured to receive an optical signal and convert the optical signal into an electrical signal.

Optionally, a plurality of the pixel sensitive units 222 are arranged in M rows×N columns, where M, N are positive integers. The total number of pixels in the image sensor is M×N.

Optionally, as shown in FIG. 4 (a), the pixel array module 200 further includes: a row and column control circuit, where the row and column control circuit includes a row control circuit 223 and a column control circuit 224. The row control circuit 223 is connected to the pixel sensitive unit row in the pixel array circuit 221 for controlling and driving the pixel sensitive unit row in the pixel array circuit 221 so as to start conversion of the received optical signal. For example, the row control circuit 223 is connected to the M-row pixel sensitive unit rows in the pixel array circuit 221 for controlling and driving each of the M rows of pixel sensitive unit row so as to start receiving and converting the optical signal. Specifically, the row control circuit 223 is connected to a gate of the field effect switch transistor of each pixel sensitive unit 222 of the M rows of pixel sensitive unit row in the pixel array circuit 221, and the photo diode is driven to start receiving and converting the optical signal by switching on the field effect switching transistor.

Optionally, the row control circuit 223 includes a shift register.

Optionally, the row control circuit 223 includes a decoder.

Optionally, the row control circuit 223 is connected to the electrical connection module 400 for receiving a first control signal and driving the ith row of the pixel sensitive unit row in the M rows of pixel sensitive unit row with the action of the first control signal, where i is a positive integer and $1 \leq i \leq M$. The first control signal is a timing control signal generated by another module in the image sensor, such as a logic control circuit in the signal processing module, and is transmitted to the row control circuit 223 through the electrical connection module 400.

Optionally, as shown in FIG. 4(a), the column control circuit 224 is connected to the pixel sensitive unit column in the pixel array circuit 221 for driving the transmission of the electrical signal of the pixel sensitive unit column in the pixel array circuit 221. For example, the column control circuit 224 is connected to the N columns of pixel sensitive unit column in the pixel array circuit 221 for driving the transmission of each column of electrical signals in the N columns of pixel sensitive unit column. Specifically, the column control circuit 224 is connected to a gate of the field effect switch transistor of each pixel sensitive unit 222 of the N columns of pixel sensitive unit column in the pixel array circuit 221, and controls output of the electrical signal converted by the photo diode.

Optionally, the column control circuit 224 includes a shift register.

Optionally, the column control circuit 224 includes a decoder.

Optionally, the column control circuit 224 includes a multiplexer connected to the electrical connection module 400 for receiving a second control signal and selecting the j row of the pixel sensitive unit row in the N rows of pixel sensitive unit rows for the output of an electrical signal with the action of the second control signal, where j is a positive integer and $1 \leq j \leq M$. The second control signal is a control signal generated by another module in the image sensor, such as a signal processing module, and is transmitted to the multiplexer of the column control circuit 224 through the electrical connection module 400.

Optionally, as shown in FIG. 4(a), the pixel array module 200 further includes: a readout circuit 225 for receiving an electrical signal output with the control of the column control circuit 224 and transmitting the electrical signal through the electrical connection module 400 to the signal processing module 300.

Optionally, the readout circuit 225 includes an amplifying circuit 226 connected to the column control circuit 224 and the electrical connection module 400. The amplifying circuit 226 is configured to amplify the electrical signal output with the control of the column control circuit 224 and transmit the electrical signal to the signal processing module 300 through the electrical connection module 400.

Optionally, the amplifying circuit 226 is a programmable gain amplifier (PGA) circuit configured to receive a third control signal, amplify by different degrees the electrical signal output by the pixel array circuit 221 with the action of the third control signal, and transmit the electrical signal to the signal processing module 300, where the third control signal is a control signal generated by another module in the image sensor, such as the signal processing module, and is transmitted to the programmable gain amplifier through the electrical connection module 400.

As shown in FIG. 4 (b), the signal processing module 300 includes an analog to digital converter (ADC) circuit 321 connected to the electrical connection module 400 for receiving an electrical signal generated by the pixel array module 200 and converting the electrical signal into a digital signal.

The electrical signal is an analog electrical signal, which can be an analog voltage signal. The analog to digital conversion circuit samples, holds, quantizes, and encodes the analog voltage signal, and converts the analog voltage signal into a digital signal proportional thereto.

Optionally, the analog to digital conversion circuit 321 includes a parallel comparison ADC circuit, a successive approximation ADC circuit, a double integral ADC circuit, and the like. Among them, the parallel comparison ADC circuit includes a resistor divider, a voltage comparator, a register and an encoder. The parallel comparison ADC circuit has the advantage that the conversion time is short, which can be as short as several tens of nanoseconds, but more components are used. For example, an n-bit converter uses $2^n-1$ comparators. The successive approximation ADC circuit includes a comparator, a ring divider, a control gate, a register, and a digital to analog converter, and the conversion time is about 1 microsecond. The double integral ADC circuit includes a comparator, a counter, an integrator and a logic control circuit. The advantage of the double integral ADC circuit is that the working performance is relatively stable and the anti-interference ability is strong, and the conversion time is about 1 to 2 milliseconds.

Optionally, as shown in FIG. 4 (b), the signal processing module 300 further includes: a digital signal processing circuit 322 connected to the analog to digital conversion circuit 321 for receiving a digital signal generated by the analog to digital conversion circuit 321 and processing the digital signal.

Optionally, the digital signal processing circuit 322 may include a digital signal processor (DSP) or other programmable logic devices for processing a digital signal, discrete gate or transistor logic devices, and discrete hardware components.

Specifically, the digital signal processing circuit can be used for signal processing such as digital filtering, adaptive filtering, fast Fourier transform, and the like. It can also be used for graphic image processing such as 2D and 3D graphics processing, image compression and transmission, image enhancement, and data encryption.

Optionally, as shown in FIG. 4 (b), the signal processing module 300 further includes: a storage circuit 323 connected to the digital processing circuit 322 for storing a particular signal, the particular signal including a signal processed by the digital processing circuit 322 which can be an image signal.

Optionally, the storage circuit 323 may include: a random access memory (RAM) and a non-volatile memory (NVM). The RAM is, for example, a static random access memory (static SRAM), and the NVM is, for example, a flash memory FLASH. It should be noted that the memories in the embodiments of the present application aim to include but are not limited to these memories and any memory of another proper type.

Optionally, as shown in FIG. 4 (b), the signal processing module 300 further includes: a logic control circuit 324 connected to the analog to digital conversion circuit 321, the digital processing circuit 322, the storage circuit 323, and the electrical connection module 400. The logic control circuit 324 is configured to generate a control signal and to transmit the control signal to the analog to digital conversion circuit 321, the digital processing circuit 322, the storage circuit 323, and the electrical connection module 400.

Specifically, the logic control circuit 324 may include a micro controller unit (MCU) or a central processing unit (CPU) and the like.

Specifically, the logic control circuit 324 is a main control circuit of the image sensor 20, coordinates the operation of other parts of the circuit, and provides control signals such as timing control signals for the row control circuit 223, the column control circuit 224, the readout circuit 225, the analog to digital conversion circuit 321, the digital processing circuit 322, and the storage circuit 323. The logic control circuit also controls the row control circuit 223 for driving the pixel sensitive unit row in the pixel array circuit 221, and controls the column control circuit 224 for controlling and outputting the electrical signal of the pixel sensitive unit column in the pixel array circuit 221, controls the readout circuit 225 for amplifying an electrical signal by different degrees, and controls the analog to digital conversion circuit 321 for converting the electrical signal into a digital signal, and controls the digital processing circuit 322 and the storage circuit 323 for processing the digital signal and store the processed image signal.

Specifically, the logic control circuit 324 is connected to the electrical connection module 400, and transmits a control signal to the row control circuit 223, the column control circuit 224, and the readout circuit 225 in the pixel array module through the electrical connection module 400.

Optionally, the signal processing module 300 further includes: a clock circuit 325 connected to the analog to the digital conversion circuit 321, the digital processing circuit 322, and the storage circuit 323, and is configured to provide a unified reference clock source for each circuit in the signal processing module 300 so that the circuit timing of each part is uniform.

Optionally, the clock circuit 325 may include a phase locked loop (PLL) circuit, an on chip oscillator (OSC), and the like.

Figure 5:
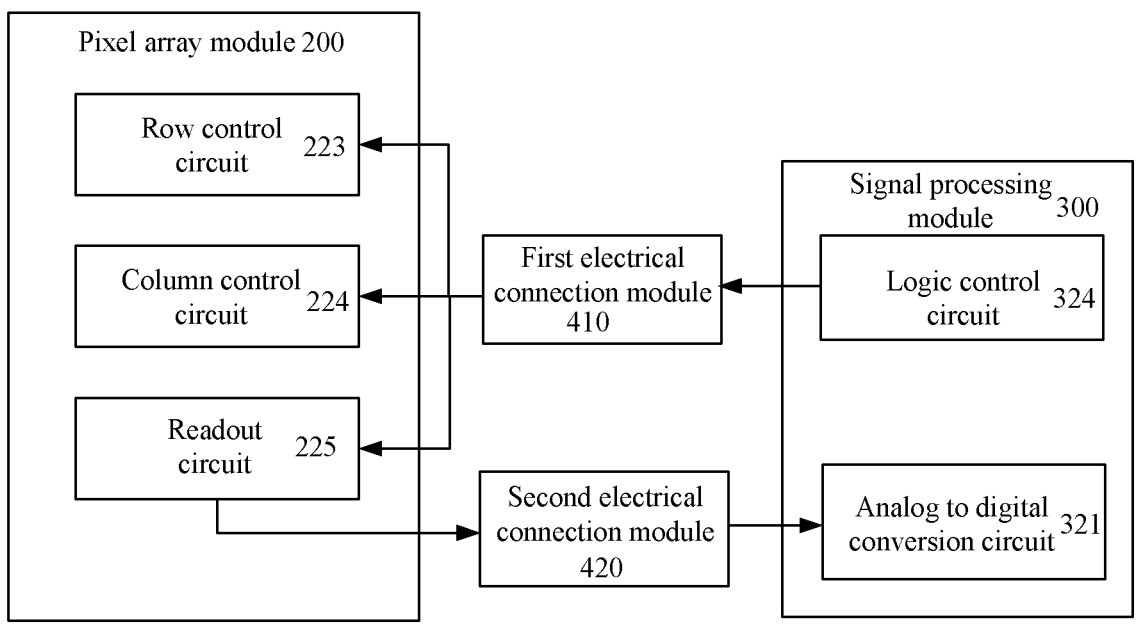
FIG. 5 is a schematic connection diagram of an image sensor according to an embodiment of the present application.

FIG. 5 illustrates a schematic connection diagram of an image sensor 20 according to an embodiment of the present application.

As shown in FIG. 5, an electrical connection module 400 includes a first electrical connection module 410 and a second electrical connection module 420. A logic control circuit in a signal processing module 300 is connected to a row control circuit 223, a column control circuit 224, and a readout circuit 225 in a pixel array module 200 through the first electrical connection module 410. The readout circuit 225 in the pixel array module 200 is connected to an analog to digital conversion circuit 321 in the signal processing module 300 through the second electrical connection module 420.

Optionally, the analog to digital conversion circuit 321 is connected to an amplifying circuit 226 in the readout circuit 225 through the second electrical connection module 420.

Optionally, the first electrical connection module 410 is configured to transmit a control signal generated by the logic control circuit 324 to the row control circuit 223, the column control circuit 224, and the readout circuit 225.

Optionally, the second electrical connection module 420 is configured to transmit an electrical signal output by the readout circuit 225 to the analog to digital conversion circuit 321.

By way of example and not limitation, the first electrical connection module 410 and the second electrical connection module 420 can also transmit other signals generated by the other pixel array module 200 and the signal processing module 300.

In the embodiment of the present application, signal transmission between the pixel array module 200 and the signal processing module 300 can be completed through the first electrical connection module 410 and the second electrical connection module 420, with a small signal type, and the implementation between the first electrical connection module 410 and the second electrical connection module 420 is simple.

Figure 6:
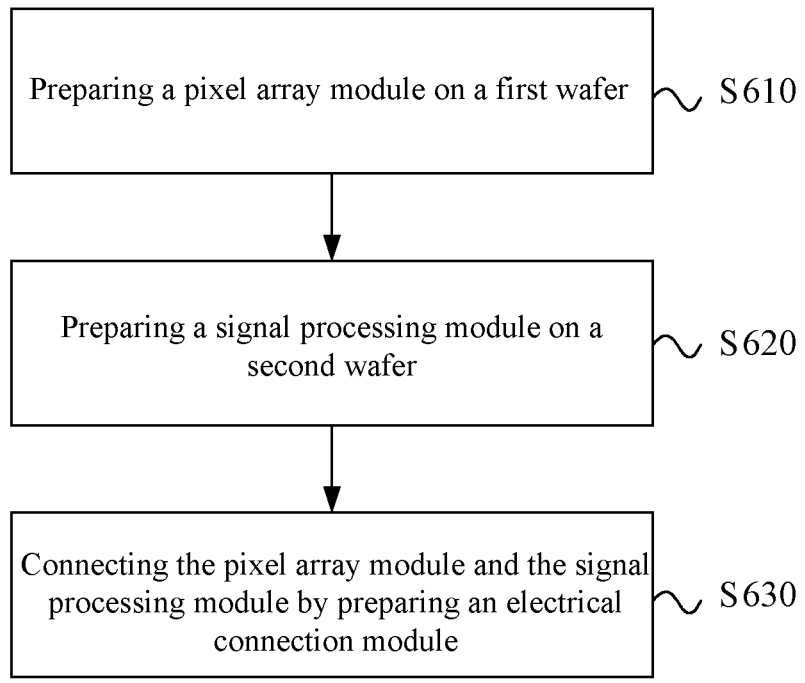
FIG. 6 is a schematic flowchart of a manufacturing method of an image sensor according to an embodiment of the present application.

FIG. 6 illustrates a schematic flowchart of a method 600 for manufacturing an image sensor according to an embodiment of the present application. The image sensor of the foregoing embodiments of the present application can be manufactured with this method 600.

S610: preparing a pixel array module on a first wafer.

Optionally, devices in the pixel array module consist of analog devices.

Optionally, the pixel array module includes a first metal interconnect layer of a first predetermined number, the devices in the pixel array module are interconnected through the first metal interconnect layer, and the first predetermined number is less than or equal to 4. For example, as shown in FIG. 3 (a), the first predetermined number is 3.

Optionally, as shown in FIG. 4 (a), the pixel array module includes a pixel array circuit including a plurality of pixel sensitive units.

Optionally, the pixel array module includes a row control circuit and a column control circuit, where the row control circuit is connected to a pixel sensitive unit row in the pixel array circuit through the first metal interconnect layer, and the column control circuit is connected to a pixel sensitive unit column in the pixel array circuit through the first metal interconnect layer.

Optionally, the pixel array module further includes a readout circuit connected to the column control circuit through the first metal interconnect layer.

Optionally, the readout circuit includes an amplifying circuit connected to the column control circuit through the first metal interconnect layer.

S620: preparing a signal processing module on a second wafer.

Optionally, devices in the pixel array module consist of analog devices.

Optionally, the signal processing module includes a second metal interconnect layer of a second predetermined number, the devices in the signal processing module are interconnected through the second metal interconnect layer, and the second predetermined number is greater than or equal to 4. For example, as shown in FIG. 3 (b), the second predetermined number is 5.

Optionally, the signal processing module includes an analog to digital conversion circuit connected to the electrical connection module through the second metal interconnect layer.

Optionally, the signal processing module further includes a digital processing circuit.

Optionally, as shown in FIG. 4 (b), the signal processing module further includes a logic control circuit connected to the analog to digital conversion circuit, the digital processing circuit, and the storage circuit through the second metal interconnect layer.

Optionally, the signal processing module further includes a storage circuit configured to be connected to the digital processing circuit through the second metal interconnect layer.

S630: connecting the pixel array module and the signal processing module by preparing an electrical connection module.

Optionally, the pixel array module is connected to the electrical connection module through the first metal interconnect layer.

Specifically, as shown in FIG. 4 (a), a row control circuit, a column control circuit, and a readout circuit in the pixel array module are connected to the electrical connection module through the first metal interconnect layer.

Optionally, the signal processing module is connected to the electrical connection module through the second metal interconnect layer.

Specifically, as shown in FIG. 4 (b), a logic control circuit and an analog to digital conversion circuit in the signal processing module are connected to the electrical connection module through the second metal interconnect layer.

Specifically, as shown in FIG. 5, the analog to digital conversion circuit in the signal processing module is connected to the readout circuit in the pixel array module through the electrical connection module.

The logic control circuit in the signal processing module is connected to the row control circuit, the column control circuit, and the readout circuit in the pixel array module through the electrical connection module.

Optionally, the electrical connection module includes a wire bonding apparatus.

Optionally, the first wafer and the second wafer are epitaxial wafers or standard wafers.

Optionally, the first wafer and the second wafer are disposed in stack.

It should be understood that although a design of two wafers is described above as an example. The technical solutions of the embodiments of the present application are not limited to two wafers. For the case of more than two wafers, the design of the two wafers described above may be used between every two wafers.

Figure 7:
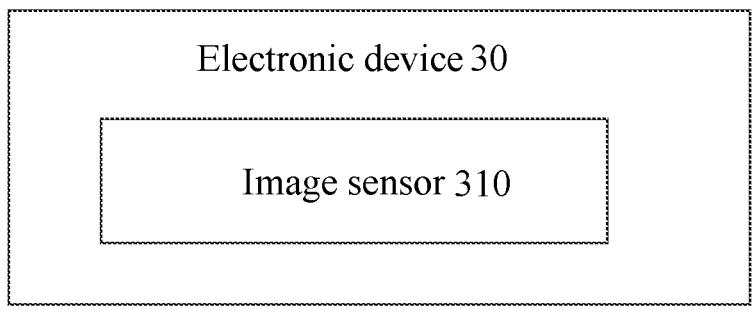
FIG. 7 is a schematic block diagram of an electronic device according to an embodiment of the present application.

As shown in FIG. 7, the embodiment of the present application also provides an electronic device 30, which may include an image sensor 310, and the image sensor 310 may be the image sensor 20 in the foregoing apparatus embodiment. The image sensor 30 can be obtained using the method described in FIG. 6, which will not be repeatedly described here for brevity.

In the several embodiments provided in the present application, it should be understood that the disclosed system, apparatus, and method may be implemented in another manner. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electrical, mechanical, or other forms.

The units described as separate components may or may not be physically separate, and components displayed as units may or may not be physical units, may be located in one position, or may be distributed on multiple network units. Some or all of the units may be selected according to actual requirements to achieve the objectives of the solutions of the embodiments.

In addition, functional units in the embodiments of this application may be integrated into one processing unit, or each of the units may exist alone physically, or two or more units are integrated into one unit.

The foregoing descriptions are merely specific embodiments of the present application, but the protection scope of the present application is not limited thereto, persons skilled in the art who are familiar with the art could readily think of variations or substitutions within the technical scope disclosed by the present application, and these variations or substitutions shall fall within the protection scope of the present application. Therefore, the protection scope of this application shall be subject to the protection scope of the claims.

What is claimed is:

1. An image sensor, comprising:
a pixel array module disposed on a first wafer;
a signal processing module disposed on a second wafer arranged horizontally to the first wafer; and
an electrical connection module connecting the pixel array module and the signal processing module and the electrical connection module comprises a wire bonding apparatus;
wherein the pixel array module is configured to receive an optical signal and convert the optical signal into an electrical signal, and the signal processing module is configured to process the electrical signal;
the pixel array module comprises a first metal interconnect layer of a first predetermined number, the first metal interconnect layer is configured for interconnection of devices in the pixel array module;
the signal processing module comprises a second metal interconnect layer of a second predetermined number, the second metal interconnect layer is configured for interconnection of devices in the signal processing module; and
the first predetermined number is smaller than the second predetermined number.

2. The image sensor according to claim 1, wherein devices in the pixel array module consist of analog devices, and devices in the signal processing module comprise digital devices.

3. The image sensor according to claim 1, wherein the first predetermined number is less than or equal to 4 and the second predetermined number is greater than or equal to 4.

4. The image sensor according to claim 3, wherein the pixel array module comprises a first passivation layer, the first passivation layer is used for isolating the pixel array device from the first metal interconnect layer, and isolating the multiple layers of metals in the first metal interconnect layer.

5. The image sensor according to claim 3, wherein the pixel array module comprises a second passivation layer, the second passivation layer is used for isolating the signal processing device from the second metal interconnect layer, and isolating the multiple layers of metals in the second metal interconnect layer.

6. The image sensor according to claim 1, wherein
the pixel array module comprises a pixel array circuit comprising a plurality of pixel sensitive units configured to receive the optical signal and convert the optical signal into the electrical signal.

7. The image sensor according to claim 6, wherein
the pixel array module further comprises a row and column control circuit configured to receive a control signal generated by the signal processing module and control the plurality of pixel sensitive units for receiving the optical signal and converting the optical signal to the electrical signal.

8. The image sensor according to claim 7, wherein
the pixel array module further comprises a readout circuit configured to receive the electrical signal output by the plurality of pixel sensitive units and send the electrical signal to the signal processing module.

9. The image sensor according to claim 8, wherein
the readout circuit comprises an amplifying circuit configured to amplify the electrical signal output by the plurality of pixel sensitive units.

10. The image sensor according to claim 1, wherein
the signal processing module comprises an analog to digital conversion circuit configured to receive the electrical signal generated by the pixel array module and convert the electrical signal into a digital electrical signal.

11. The image sensor according to claim 10, wherein
the signal processing module further comprises a digital processing circuit configured to receive the digital electrical signal generated by the analog to digital conversion circuit and process the digital electrical signal.

12. The image sensor according to claim 11, wherein
the signal processing module further comprises a logic control circuit configured to generate a control signal.

13. The image sensor according to claim 12, wherein
the signal processing module further comprises a storage circuit configured to store a signal processed by the digital processing circuit.

14. The image sensor according to claim 13, wherein
the analog to digital conversion circuit is connected to the amplifying circuit through the electrical connection module; and
the logic control circuit is connected to the row and column control circuit and the readout circuit through the electrical connection module.

15. The image sensor according claim 1, wherein
the electrical connection module is configured to transmit the electrical signal generated by the pixel array module and a control signal generated by the signal processing module.

16. The image sensor according to claim 1, wherein
the first wafer is a standard wafer and the second wafer is an epitaxial wafer, and the cost of the first wafer is lower than the cost of the second wafer.

17. The image sensor according to claim 1, wherein width of wire line in the second metal interconnect layer are smaller than width of wire line in the first metal interconnect layer, and space of wire line in the second metal interconnect layer are smaller than space of wire line in the first metal interconnect layer.

18. The image sensor according to claim 1, wherein device spacing of the devices in the signal processing module is smaller than device spacing of the devices in the pixel array module, and performance of the devices in the signal processing module is better than performance of the devices in the pixel array module.

19. The image sensor according to claim 1, wherein area of the signal processing module is smaller than the area of the pixel array module and the cost per unit area of the signal processing module is greater than the cost per unit area of the pixel array module.

20. An electronic device, comprising an image sensor, wherein
the image sensor, comprising:
a pixel array module disposed on a first wafer;
a signal processing module disposed on a second wafer arranged horizontally to the first wafer; and
an electrical connection module connecting the pixel array module and the signal processing module and the electrical connection module comprises a wire bonding apparatus;
wherein the pixel array module is configured to receive an optical signal and convert the optical signal into an electrical signal, and the signal processing module is configured to process the electrical signal;
the pixel array module comprises a first metal interconnect layer of a first predetermined number, the first metal interconnect layer is configured for interconnection of devices in the pixel array module;
the signal processing module comprises a second metal interconnect layer of a second predetermined number, the second metal interconnect layer is configured for interconnection of devices in the signal processing module; and
the first predetermined number is smaller than the second predetermined number.

* * * * *